(12) United States Patent
Fujiwara

(10) Patent No.: US 12,334,378 B2
(45) Date of Patent: Jun. 17, 2025

(54) TRAVELING VEHICLE SYSTEM

(71) Applicant: MURATA MACHINERY, LTD., Kyoto (JP)

(72) Inventor: Hidetoshi Fujiwara, Ise (JP)

(73) Assignee: MURATA MACHINERY, LTD., Kyoto (JP)

( * ) Notice: Subject to any disclaimer, the term of this patent is extended or adjusted under 35 U.S.C. 154(b) by 759 days.

(21) Appl. No.: 17/636,049

(22) PCT Filed: Jul. 1, 2020

(86) PCT No.: PCT/JP2020/025892
§ 371 (c)(1),
(2) Date: Feb. 17, 2022

(87) PCT Pub. No.: WO2021/039105
PCT Pub. Date: Mar. 4, 2021

(65) Prior Publication Data
US 2022/0344189 A1    Oct. 27, 2022

(30) Foreign Application Priority Data
Aug. 29, 2019 (JP) ................... 2019-157169

(51) Int. Cl.
*H01L 21/677* (2006.01)
*B65G 1/04* (2006.01)
(Continued)

(52) U.S. Cl.
CPC ...... *H01L 21/67733* (2013.01); *B65G 1/0457* (2013.01); *G05D 1/02* (2013.01);
(Continued)

(58) Field of Classification Search
CPC ......... H01L 21/67276; H01L 21/67727; H01L 21/67733; H01L 21/67736;
(Continued)

(56) References Cited

U.S. PATENT DOCUMENTS 8,490,802 B2 * 7/2013 Honda ................ H01L 21/6773
212/331
9,073,691 B2 * 7/2015 Morimoto ............ B65G 1/0457
(Continued)

FOREIGN PATENT DOCUMENTS

JP    2015107880 A * 6/2015 ............. B08B 15/02
JP    2017-068455 A    4/2017

*Primary Examiner* — S. Joseph Morano
*Assistant Examiner* — Cheng Lin
(74) *Attorney, Agent, or Firm* — Keating & Bennett, LLP

(57) ABSTRACT

A traveling vehicle system includes a traveling track, a working track, a mover to move a traveling vehicle between a first position on the traveling track and the working track, and a transportation controller configured or programmed to control at least the traveling vehicle and the mover. The transportation controller is configured or programmed to transmit to the traveling vehicle a first command to travel to the first position and transmit to the mover a third command to move the traveling vehicle stopped at the first position to the working track after or simultaneously when transmitting to the traveling vehicle stopped at the first position a second command to lead a state in which the traveling vehicle is movable by the mover.

17 Claims, 12 Drawing Sheets

(51) Int. Cl.
*G05D 1/00* (2006.01)
*H01L 21/67* (2006.01)

(52) U.S. Cl.
CPC .. *H01L 21/67276* (2013.01); *H01L 21/67727* (2013.01); *B65G 2201/0297* (2013.01)

(58) Field of Classification Search
CPC ............ H01L 21/67715; B65G 1/0457; B65G 1/0492; B65G 35/06; B65G 2201/0297; B61B 3/02; G05D 1/02
See application file for complete search history.

(56) References Cited

U.S. PATENT DOCUMENTS

| | | | | |
|---|---|---|---|---|
| 9,536,766 | B2* | 1/2017 | Kinugawa | ......... H01L 21/67379 |
| 9,896,275 | B2* | 2/2018 | Ikenaga | ................. B65G 43/00 |
| 10,083,847 | B2* | 9/2018 | Tomida | ............. H01L 21/67259 |
| 10,507,846 | B2* | 12/2019 | Meissner | ............. B65G 63/004 |
| 2005/0139441 | A1* | 6/2005 | Nakao | ..................... B60L 5/005 |
| | | | | 191/22 R |
| 2017/0247190 | A1* | 8/2017 | Horii | .................... B65G 19/025 |
| 2018/0297620 | A1* | 10/2018 | Murakami | .............. B61B 10/02 |

* cited by examiner

Fig.2
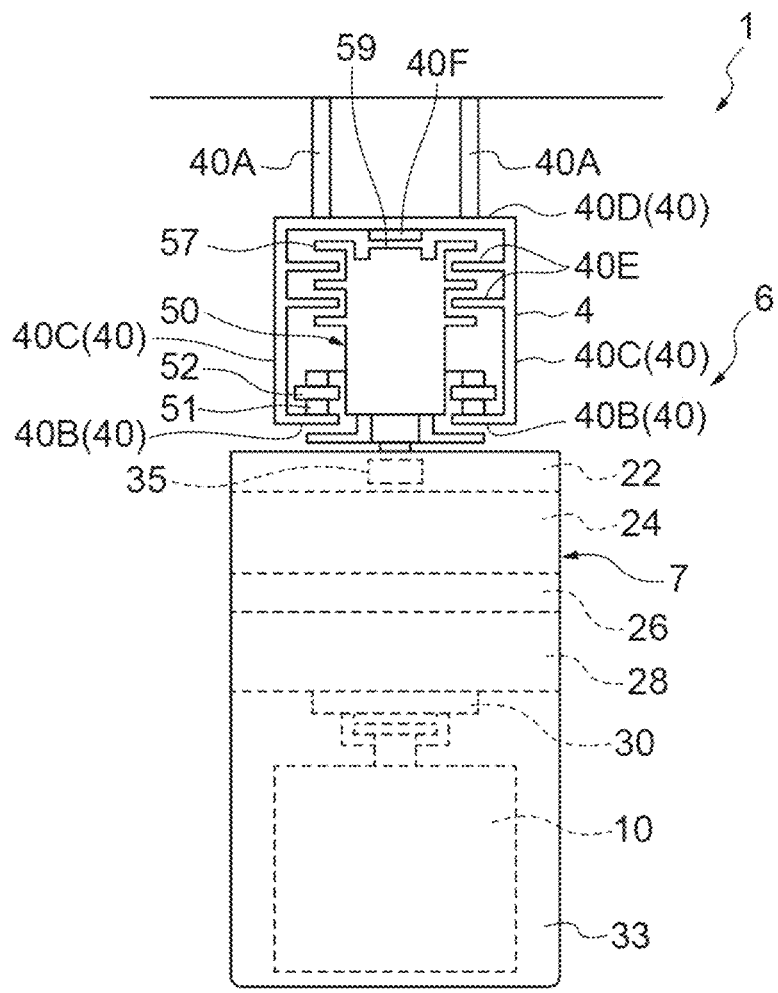
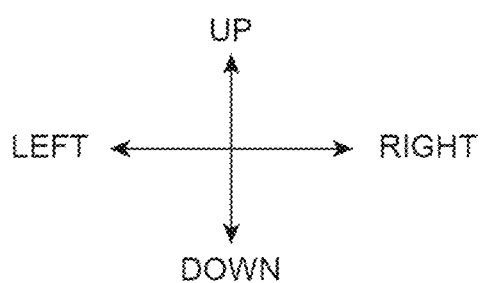

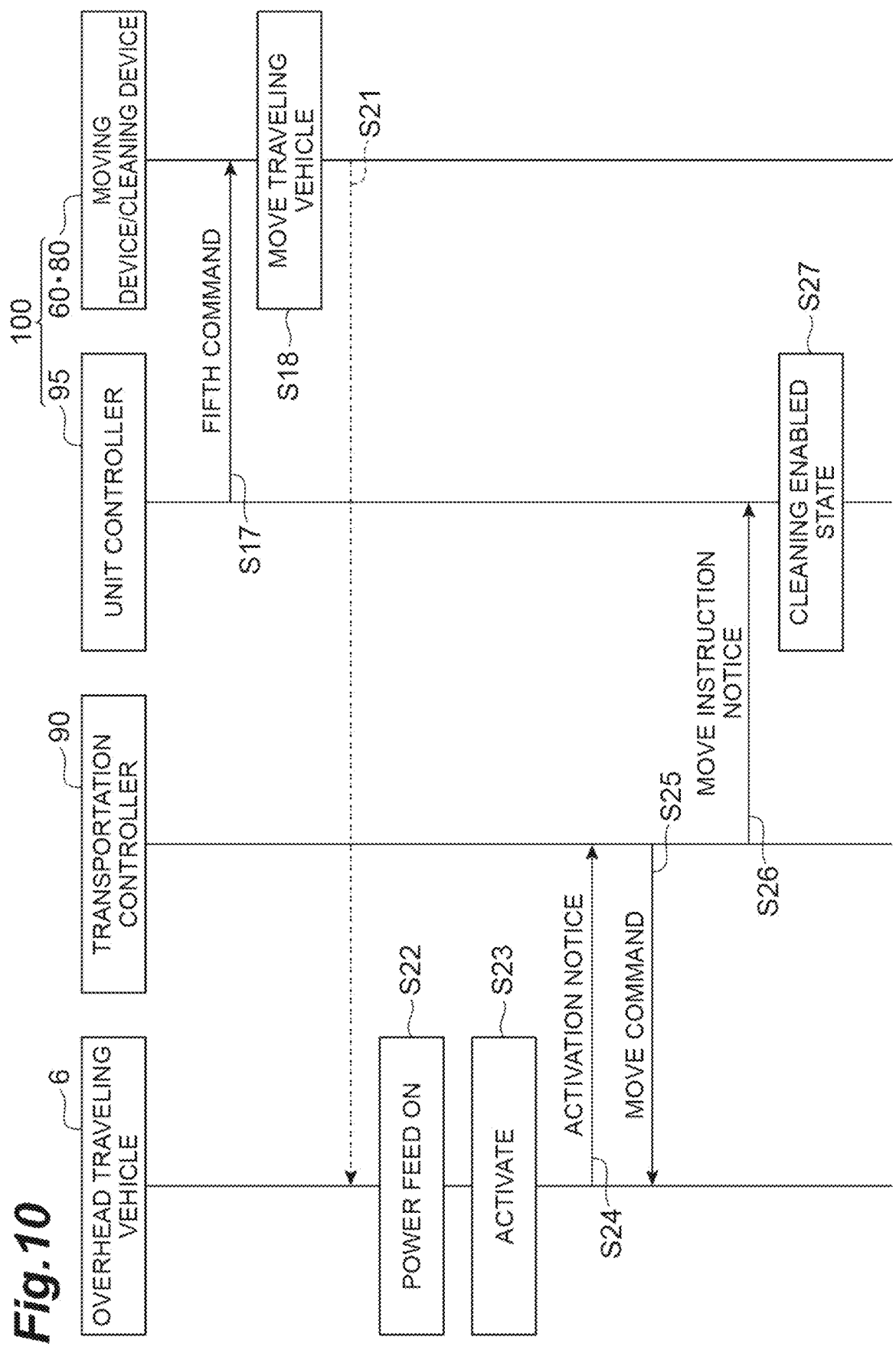

TRAVELING VEHICLE SYSTEM

BACKGROUND OF THE INVENTION

1. Field of the Invention

An aspect of the present invention relates to a traveling vehicle system.

2. Description of the Related Art

An overhead traveling vehicle traveling on a track to transport an article is known. Japanese Unexamined Patent Publication No. 2015-107880 discloses a traveling vehicle system (transport vehicle system) configured to efficiently clean off dust and the like generated when a traveling vehicle travels on a track laid on a ceiling. When a traveling vehicle is cleaned in the traveling vehicle system in Japanese Unexamined Patent Publication No. 2015-107880, the traveling vehicle is moved to a predetermined withdrawal place along the track, thereafter a lifting device disposed at the withdrawal place lowers the traveling vehicle to the floor, and a cleaning device disposed on the floor cleans the traveling vehicle. When a traveling vehicle is cleaned in this traveling vehicle system, the traveling vehicle is moved to the withdrawal place along the track, and the subsequent movement of the traveling vehicle to the lifting device is performed by manipulation of manual operation command means (generally called a remote controller) by an operator.

SUMMARY OF THE INVENTION

Although electric power is supplied to the track that constitutes the lifting device in the traveling vehicle system described above, there is a case where a traveling vehicle has to be moved into a lifting device on a non-power feed track with no power supply. In such a system, the operator manually moves a traveling vehicle into the lifting device. However, such a method requires the attendance of operators on the site and is burdensome. While less human intervention is desired in recent years, there is a demand to automate movement of a traveling vehicle from a power feed track to a non-power feed track without intervention of operators.

Preferred embodiments of the present invention provide traveling vehicle systems in each of which movement of a traveling vehicle from a power feed track to a non-power feed track is automated.

A traveling vehicle system according to an aspect of a preferred embodiment of the present invention includes a power feed track including a power feeder to supply electric power to a traveling driver of a traveling vehicle, a non-power feed track connected to the power feed track and having no power feeder, a mover to move the traveling vehicle between a first position on the power feed track and the non-power feed track, and a controller configured or programmed to control at least the traveling vehicle and the mover. The controller is configured or programmed to transmit to the traveling vehicle a first command to travel to the first position, transmit to the traveling vehicle stopped at the first position a second command to adopt a state in which the traveling vehicle is movable by the mover and simultaneously or thereafter transmit to the mover a third command to move the traveling vehicle stopped at the first position to the non-power feed track.

In the traveling vehicle system with this configuration, the traveling vehicle is brought into a state in which the traveling vehicle can be freely moved by the mover, at a position before entering the non-power feed track, and movement of the traveling vehicle by the mover is started. With this configuration, movement of the traveling vehicle from the power feed track to the non-power feed track can be automated.

In a traveling vehicle system according to an aspect of a preferred embodiment of the present invention, the controller may be configured or programmed to transmit to the traveling vehicle the second command to disable control from outside at least in the traveling driver. In this configuration, the traveling vehicle can be brought into a state in which the traveling vehicle can be freely moved by the mover, with simple control.

In a traveling vehicle system according to an aspect of a preferred embodiment of the present invention, the traveling driver may include a wheel to be braked at a time of no power feed and an auxiliary wheel to rotate freely. The power feed track between the first position and the non-power feed track and the non-power feed track may include a lower support portion to support the wheel and the auxiliary wheel from below. The lower support portion may be structured such that a first portion facing the auxiliary wheel is positioned above a second portion facing the wheel, in a vertical direction. The controller may be configured or programmed to transmit to the traveling vehicle stopped at the first position a fourth command to cut off power supply at least to the traveling driver. The wheel in the traveling vehicle with this configuration does not rotate easily in a state in which electric power is not supplied to the traveling driver. It is therefore difficult to move the traveling vehicle with the wheel in contact in a state in which power supply to the traveling driver is cut off and in a state in which electric power is not supplied because the traveling vehicle is positioned on the working track. In this respect, in the traveling vehicle system with this configuration, even in a state in which power supply is cut off or electric power is not supplied, the traveling vehicle can be moved easily because only the auxiliary wheel that rotates freely is in contact with the working track. That is, the traveling vehicle can be brought into a state in which the traveling vehicle can be freely moved by the mover.

In a traveling vehicle system according to an aspect of a preferred embodiment of the present invention, the controller may be configured or programmed to transmit to the mover a fifth command to move the traveling vehicle from the non-power feed track to the first position or to a second position on the power feed track connected to the power feed track having the first position with the non-power feed track interposed. In this configuration, movement of the traveling vehicle from the non-power feed track to the power feed track can be automated. That is, movement of the traveling vehicle between the non-power feed track and the power feed track can be automated.

In a traveling vehicle system according to an aspect of a preferred embodiment of the present invention, the traveling driver may be configured or programmed such that control from outside is enabled when a state in which electric power is not supplied changes to a state in which electric power is supplied. In this configuration, when the traveling vehicle is moved by the mover from the non-power feed track to the power feed track, control of the traveling vehicle from the outside is automatically enabled.

A traveling vehicle system according to an aspect of a preferred embodiment of the present invention may further include a cleaner to clean the traveling vehicle moved to the non-power feed track. The controller may be configured or programmed to transmit to the cleaner a sixth command to clean the traveling vehicle, after transmitting the third command to the mover. In the traveling vehicle system with this configuration, in addition to movement of the traveling vehicle from the power feed track to the non-power feed track, a cleaning process by the cleaner can also be automated.

According to various preferred embodiments of the present invention, movement of a traveling vehicle from a power feed track to a non-power feed track can be automated.

The above and other elements, features, steps, characteristics and advantages of the present invention will become more apparent from the following detailed description of the preferred embodiments with reference to the attached drawings.

BRIEF DESCRIPTION OF THE DRAWINGS

FIG. 2 is a front view of a traveling vehicle in FIG. 1 as viewed from a traveling direction.

FIG. 10 is a sequence diagram illustrating operation of each unit in cleaning of a traveling vehicle in the traveling vehicle system.

DETAILED DESCRIPTION OF THE PREFERRED EMBODIMENTS

Figure 4:
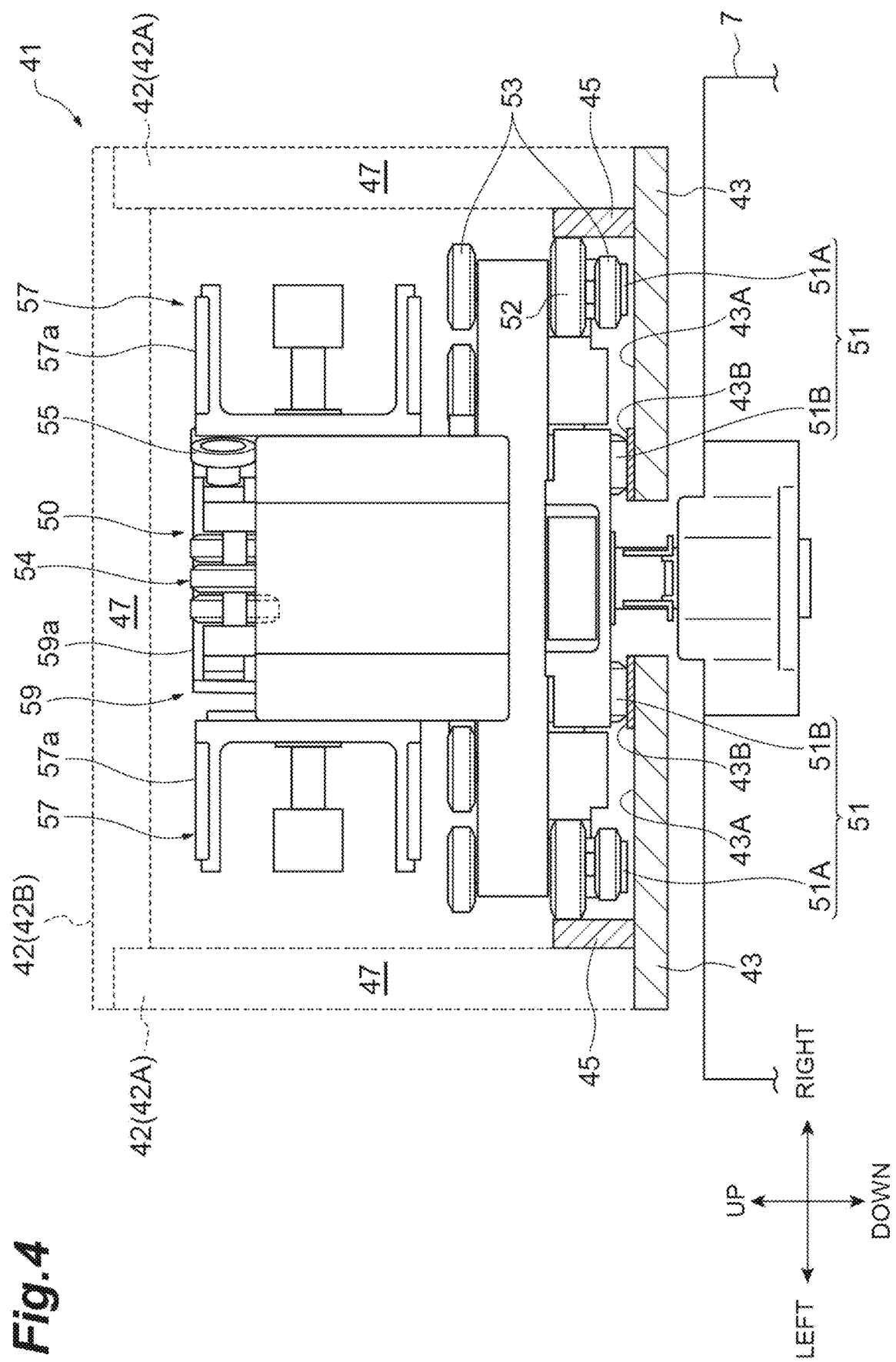
FIG. 4 is a cross-sectional view illustrating the working track in FIG. 3 and a traveling unit of the traveling vehicle.
Figure 7:
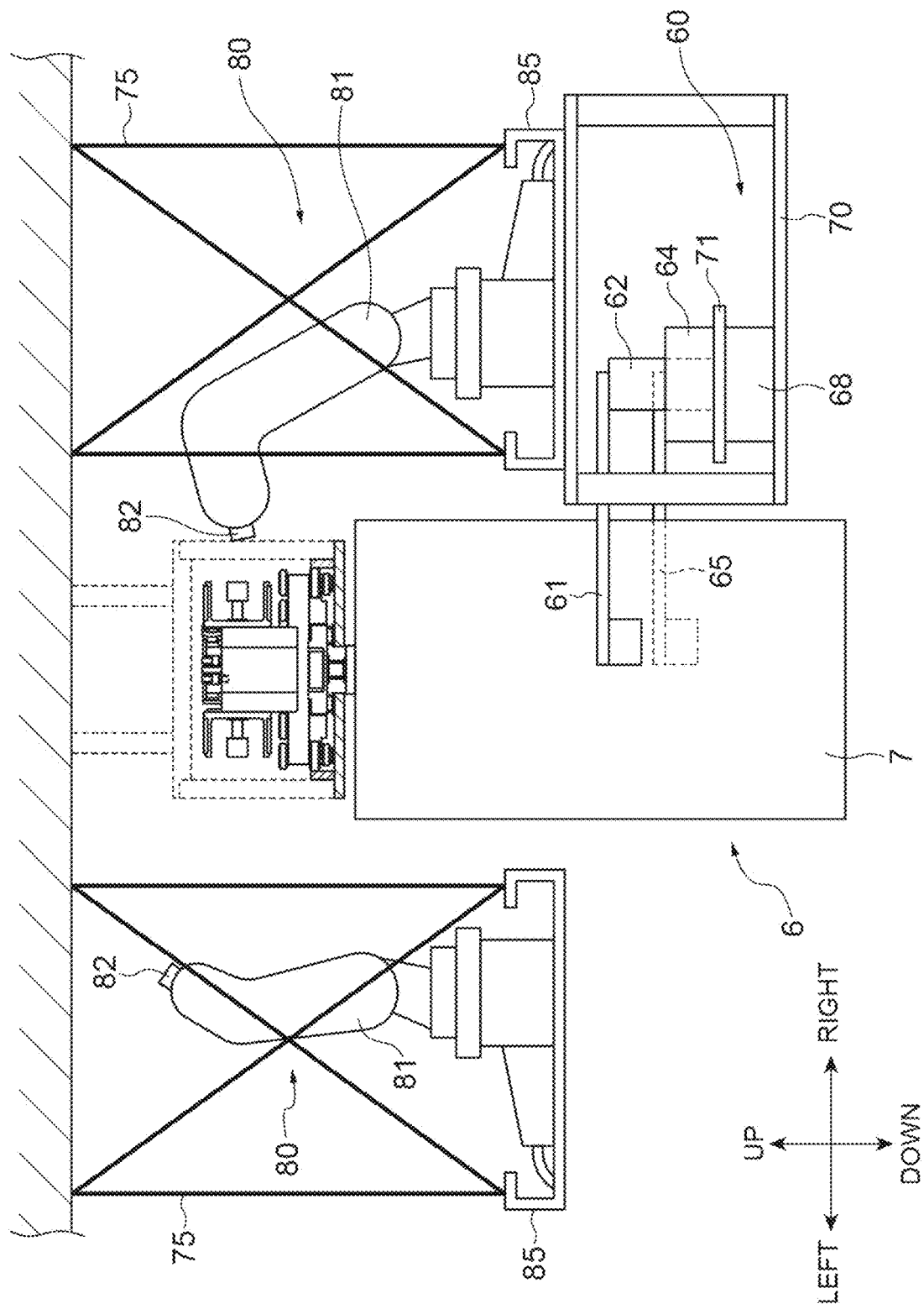
FIG. 7 is a cross-sectional view of the moving device and a suction device disposed in a work area in a preferred embodiment of the present invention as viewed from the extending direction of the working track.
Figure 8:
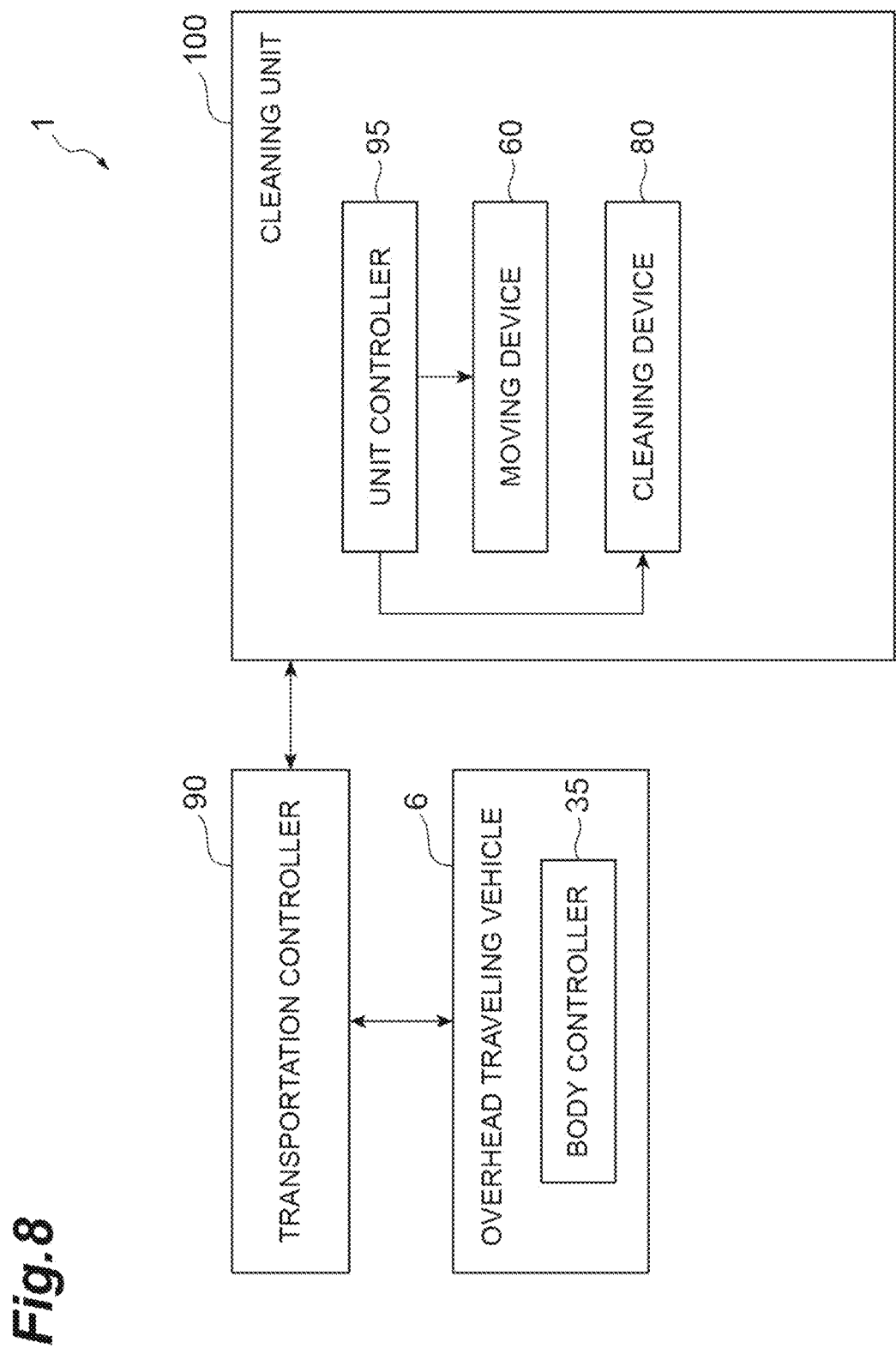
FIG. 8 is a block diagram illustrating a functional configuration of the traveling vehicle system.

Preferred embodiments according to aspects of the present invention will be described in detail below with reference to the drawings. In the description of the drawings, the same elements are denoted by the same reference signs and an overlapping description is omitted. In FIG. 2, FIG. 4, and FIG. 7, "up", "down", "left", "right", "front", and "back" directions are defined for convenience of explanation.

Figure 1:
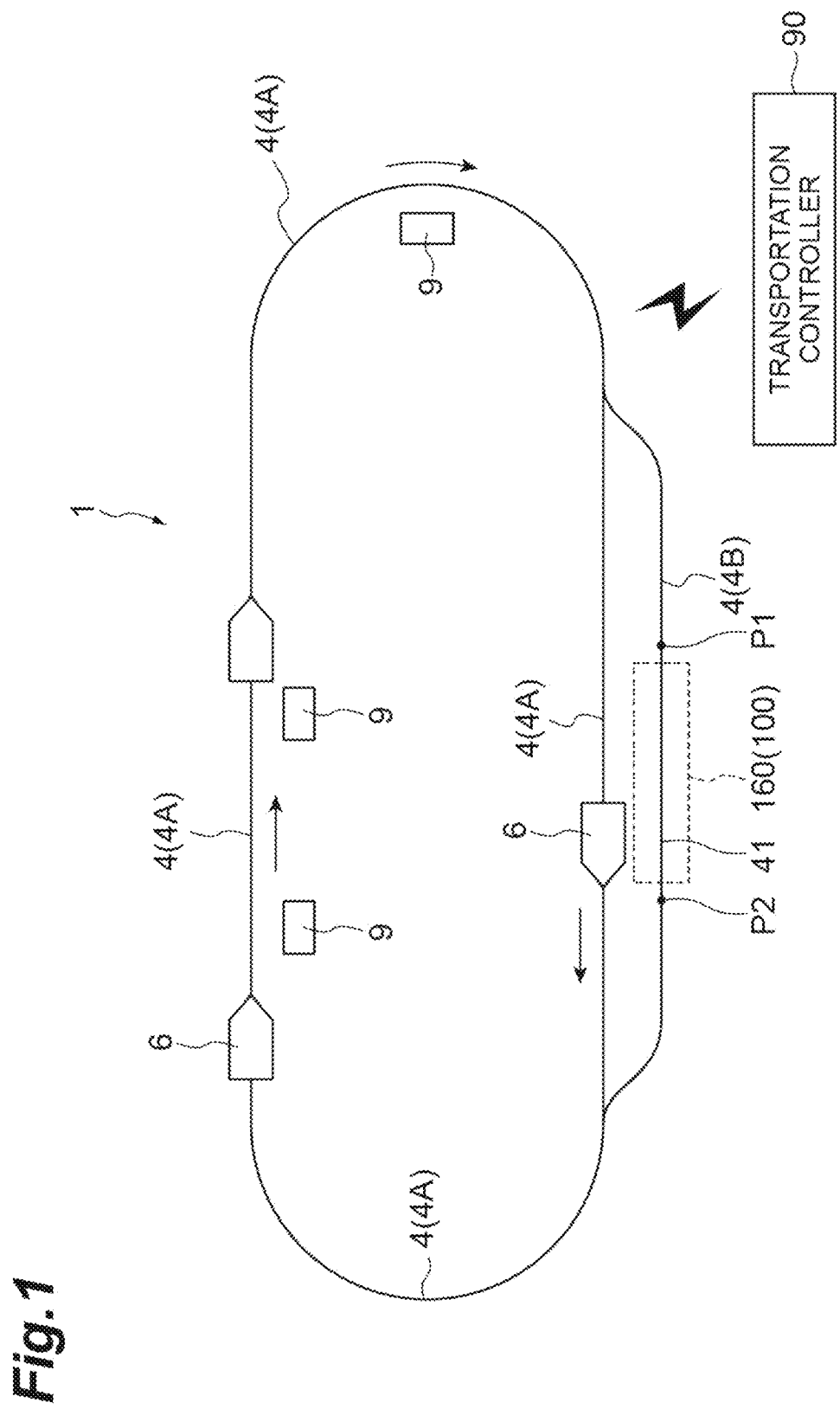
FIG. 1 is a schematic plan view illustrating a traveling vehicle system according to a preferred embodiment of the present invention.

As illustrated in FIG. 1 and FIG. 2, a traveling vehicle system 1 is a system for transporting an article 10 between placement sections 9 using overhead traveling vehicles 6 (hereinafter referred to as traveling vehicles 6) movable along a traveling track 4. Examples of the article 10 include containers such as a front opening unified pod (FOUP) storing a plurality of semiconductor wafers and a reticle pod storing a glass substrate, and common parts. The traveling vehicle system 1 includes the traveling track (power feed track) 4, a plurality of traveling vehicles 6, a plurality of placement sections 9, a working track (non-power feed track) 41, and a cleaning unit 100 (see FIG. 7).

The traveling track 4 is laid, for example, in the vicinity of a ceiling that is a space above the worker's head. The traveling track 4 is, for example, suspended from the ceiling. The traveling track 4 is a predetermined traveling path for the traveling vehicles 6 to travel. The traveling track 4 is supported by struts 40A and 40A. The traveling track 4 of the traveling vehicle system 1 includes a main line 4A extending around a predetermined area in one direction and a retreat section 4B to guide the traveling vehicle 6 to the working track 41 having a working area 160 for maintenance of the traveling vehicle 6. In the retreat section 4B, the traveling vehicle 6 also moves in the predetermined one direction.

The traveling track 4 includes a tubular rail body 40 having a pair of lower surface portions 40B and 40B, a pair of side surface portions 40C and 40C, and a top surface portion 40D, a power feeder 40E, and a magnetic plate 40F. The rail body 40 accommodates a traveling unit (traveling driver) 50 of each of the traveling vehicles 6. The lower surface portions 40B extend in the traveling direction of the traveling vehicle 6 and each define a lower surface of the rail body 40. The lower surface portions 40B are plate-shaped members to allow the traveling rollers 51 of the traveling vehicle 6 to roll and travel. The side surface portions 40C extend in the traveling direction of the traveling vehicle 6 and each define a side surface of the rail body 40. The top surface portion 40D extends in the traveling direction of the traveling vehicle 6 and defines an upper surface of the rail body 40.

The power feeder (power feed line) 40E is a section that supplies electric power to power feed cores 57 of the traveling vehicle 6 and transmits/receives a signal to/from the power feed cores 57. The power feeder 40E is fixed to each of a pair of side surface portions 40C and 40C and extends along the traveling direction. The power feeder 40E supplies electric power to the power feed cores 57 (see FIG. 4) in a contactless manner. The magnetic plate 40F produces magnetic force for travel or stop in a linear DC motor (LDM) 59 of the traveling vehicle 6. The magnetic plate 40F is fixed to the top surface portion 40D and extends along the traveling direction.

The traveling vehicle 6 travels along the traveling track 4 and transports the article 10. The traveling vehicle 6 is configured or programmed to transfer the article 10. The traveling vehicle 6 is an automated overhead traveling vehicle. The number of traveling vehicles 6 included in the traveling vehicle system 1 is not limited and is more than one. Each traveling vehicle 6 includes a main body 7, a traveling unit 50, and a body controller 35. The main body 7 includes a body frame 22, a traverse unit 24, a θ drive 26, an elevation driver 28, an elevation stage 30, and a cover 33.

The body frame 22 is connected to the traveling unit 50 and supports the traverse unit 24, the θ drive 26, the elevation driver 28, the elevation stage 30, and the cover 33. The traverse unit 24 allows the θ drive 26, the elevation driver 28, and the elevation stage 30 to collectively traverse in a direction normal to the traveling direction of the traveling track 4. The θ drive 26 turns at least one of the elevation driver 28 and the elevation stage 30 within a predetermined angle range in a horizontal plane. The elevation driver 28 elevates and lowers the elevation stage 30 by reeling or unreeling a suspension member such as a wire, a rope, or a belt. The elevation stage 30 has a chuck and can grip or release the article 10. A pair of covers 33 is provided, for example, at the front and the back in the traveling direction of the traveling vehicle 6. The covers 33 prevent the article 10 from falling during transport by making claws (not illustrated) and the like not depicted appear and disappear.

The traveling unit 50 allows the traveling vehicle 6 to travel along the traveling track 4. As illustrated in FIG. 4, the traveling unit 50 includes the traveling rollers 51, side rollers 52, branching rollers 53, auxiliary rollers 54, slanted rollers 55, power feed cores 57, and the LDM 59. In FIG. 2, the branching rollers 53, the auxiliary rollers 54, and the slanted rollers 55 are not illustrated.

The traveling rollers 51 are a roller pair including an outer wheel 51A as a wheel and an inner wheel 51B as an auxiliary wheel. The traveling rollers 51 are disposed on the left and right ends at the front and the back of the traveling unit 50. The traveling rollers 51 roll on a pair of lower surface portions 40B and 40B (see FIG. 2) of the traveling track 4 or lower support portions 43 in FIG. 4 described later. The outer wheels 51A in the present preferred embodiment are configured so as not to easily rotate in a state in which electric power is not supplied to the traveling unit 50. That is, the outer wheels 51A are braked not to rotate in a state in which the power feed cores 57 are not supplied with electric power.

The side rollers 52 are disposed to sandwich each of the outer wheels 51A of the traveling rollers 51 in the front-back direction. The side rollers 52 are provided so as to be able to come into contact with the side surface portions 40C (see FIG. 2) of the traveling track 4 or side support portions 45 in FIG. 4 described later. The branching rollers 53 are disposed to sandwich each of the side rollers 52 in the up-down direction. The side rollers 52 are provided so as to be able to come into contact with a guide (not illustrated) disposed at a connection section or a branching section of the traveling track 4.

The auxiliary rollers 54 are roller groups, each including a set of three rollers, provided at the front and the back of the traveling unit 50. The auxiliary rollers 54 are provided in order to prevent the LDMs 59, the power feed cores 57, and the like from coming into contact with the magnetic plate 40F (see FIG. 2) disposed on the upper surface of the traveling track 4 when the traveling unit 50 is inclined to the front and back during traveling, for example, due to acceleration/deceleration. The slanted rollers 55 are provided at four corners of the LDM 59. The slanted rollers 55 are disposed so as to be slanted from the front-back direction. The slanted rollers 55 are provided in order to prevent inclination due to centrifugal force that occurs when the traveling unit 50 travels a curve section.

The power feed cores 57 are disposed at the front and the back of the traveling unit 50 so as to sandwich the LDM 59 in the left-right direction. Contactless power feeding and contactless transmission/reception of a variety of signals are performed between the power feed cores 57 and the power feeder 40E (see FIG. 2) disposed at the traveling track 4. The power feed cores 57 exchange a signal with the body controller 35. The LDMs 59 are provided at the front and the back of the traveling unit 50. The LDM 59 uses an electromagnet to produce magnetic force for traveling or stopping between the LDM 59 and the magnetic plate 40F (see FIG. 2) disposed on the upper surface of the traveling track 4.

The traveling unit 50 is controlled by a transportation controller (controller) 90 described in detail later through the body controller 35. Specifically, a command from the transportation controller 90 is transmitted to the body controller 35, and the body controller 35 having received the command controls the traveling unit 50. In a state in which electric power is supplied, the traveling unit 50 can be controlled by the transportation controller 90 external to the traveling vehicle 6. When the traveling unit 50 changes from a state in which electric power is not supplied to a state in which electric power is supplied, a command from the transportation controller 90 is transmitted to the body controller 35, and the body controller 35 having received the command is ready to control the traveling unit 50.

As illustrated in FIG. 1, the placement sections 9 are arranged along the traveling track 4 and provided at positions where the traveling vehicle 6 can deliver the article 10. The placement sections 9 include a buffer and a delivery port. The buffer is a placement section on which the article 10 is temporarily placed. The buffer is a placement section on which the article 10 is temporarily placed when the article 10 transported by the traveling vehicle 6 is unable to be transferred to a target delivery port, for example, for the reason that another article 10 is placed on the target delivery port. The delivery port is, for example, a placement section for delivering the article 10 to a semiconductor processing device (not illustrated) such as a cleaning device, a deposition device, a lithography device, an etching device, a thermal process device, and a planarization device. The processing device is not limited to a specific device and may be a variety of devices.

For example, the placement sections 9 may be arranged to the side of the traveling track 4. In this case, the traveling vehicle 6 allows the traverse unit 24 to traverse the elevation driver 28 and the like and slightly elevates and lowers the elevation stage 30 to deliver the article 10 to/from the placement section 9. Although not illustrated, the placement sections 9 may be arranged immediately below the traveling track 4. In this case, the traveling vehicle 6 elevates and lowers the elevation stage 30 to deliver the article 10 to/from the placement section 9.

The body controller 35 is an electronic control unit including a central processing unit (CPU), a read only memory (ROM), and a random access memory (RAM). The body controller 35 is configured or programmed to control various operations in the traveling vehicle 6. Specifically, the body controller 35 is configured or programmed to control the traveling unit 50, the traverse unit 24, the θ drive 26, the elevation driver 28, and the elevation stage 30. The body controller 35 can be configured, for example, as software of a computer program stored in the ROM, loaded into the RAM, and executed by the CPU. The body controller 35 may be configured as hardware with, for example, electronic circuitry. The body controller 35 communicates with the transportation controller 90 (see FIG. 1) using, for example, the power feeder 40E (feeder line) of the traveling track 4.

Figure 5:
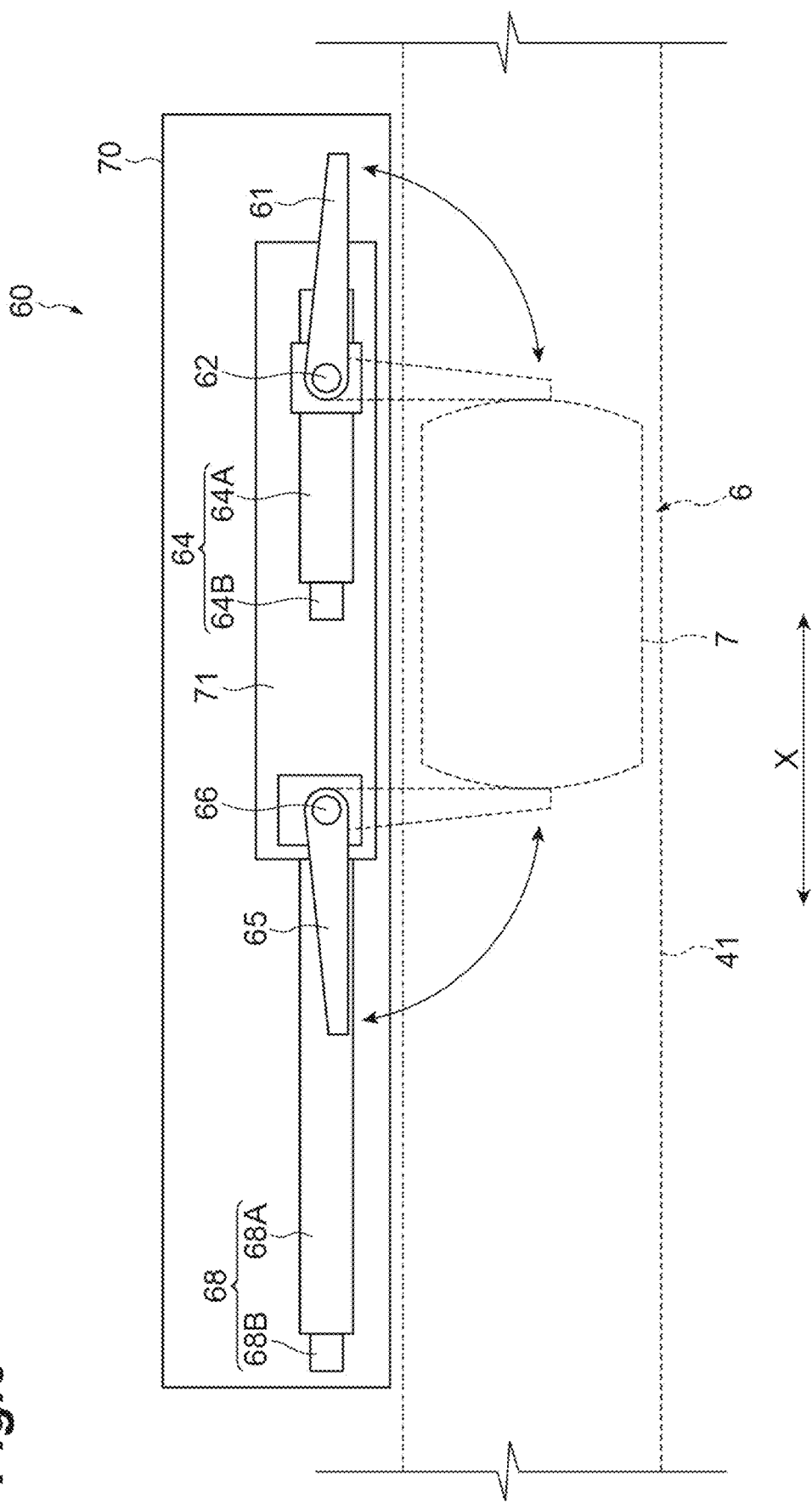
FIG. 5 is a plan view illustrating a moving device in a preferred embodiment of the present invention.
Figure 6:
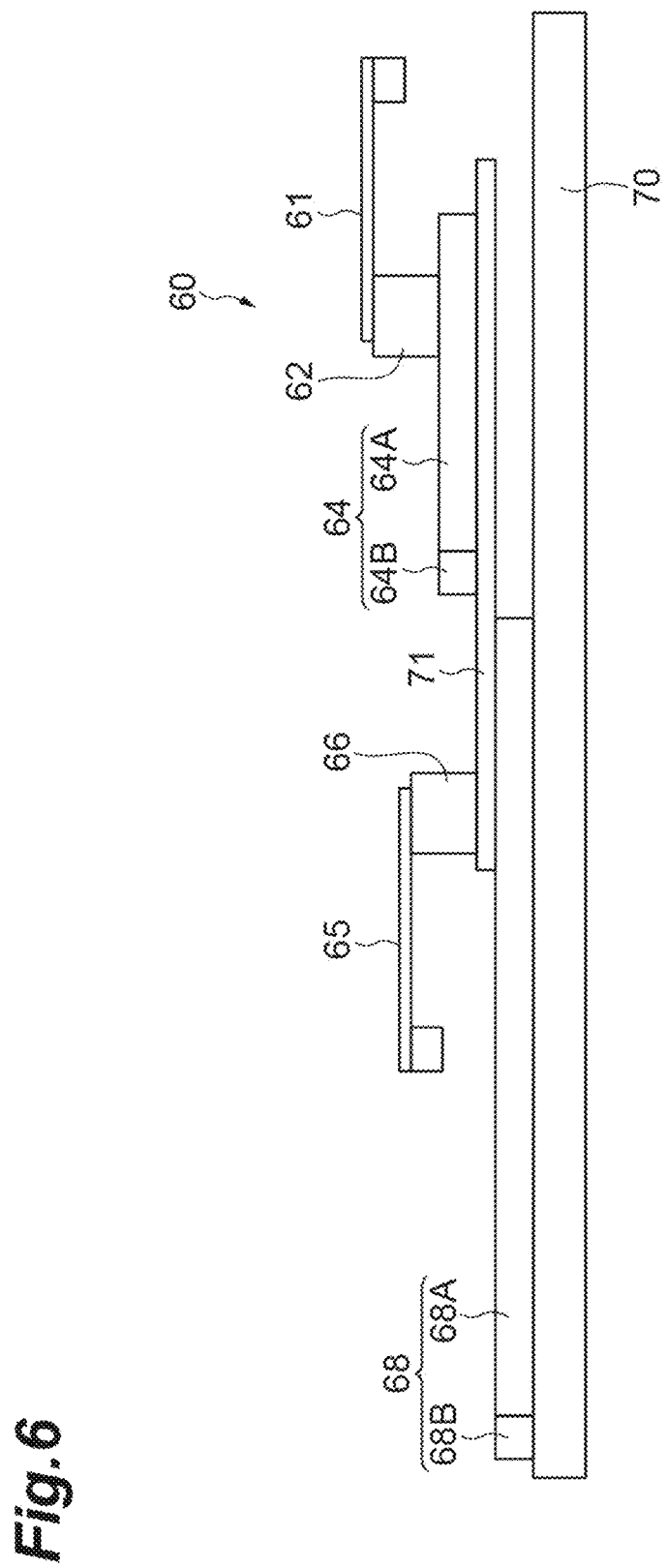
FIG. 6 is a side view illustrating the moving device in FIG. 5.

As illustrated in FIG. 1, the working area 160 is an area provided in a portion of the retreat section 4B and in which maintenance of the traveling rollers 51, the power feed cores 57, and the like of the traveling unit 50 included in the traveling vehicle 6 is performed. In the working area 160, the working track 41 (see FIG. 3), a moving device 60 (see FIG. 5 and FIG. 6), and a suction device 80 (see FIG. 7) are provided.

Figure 3:
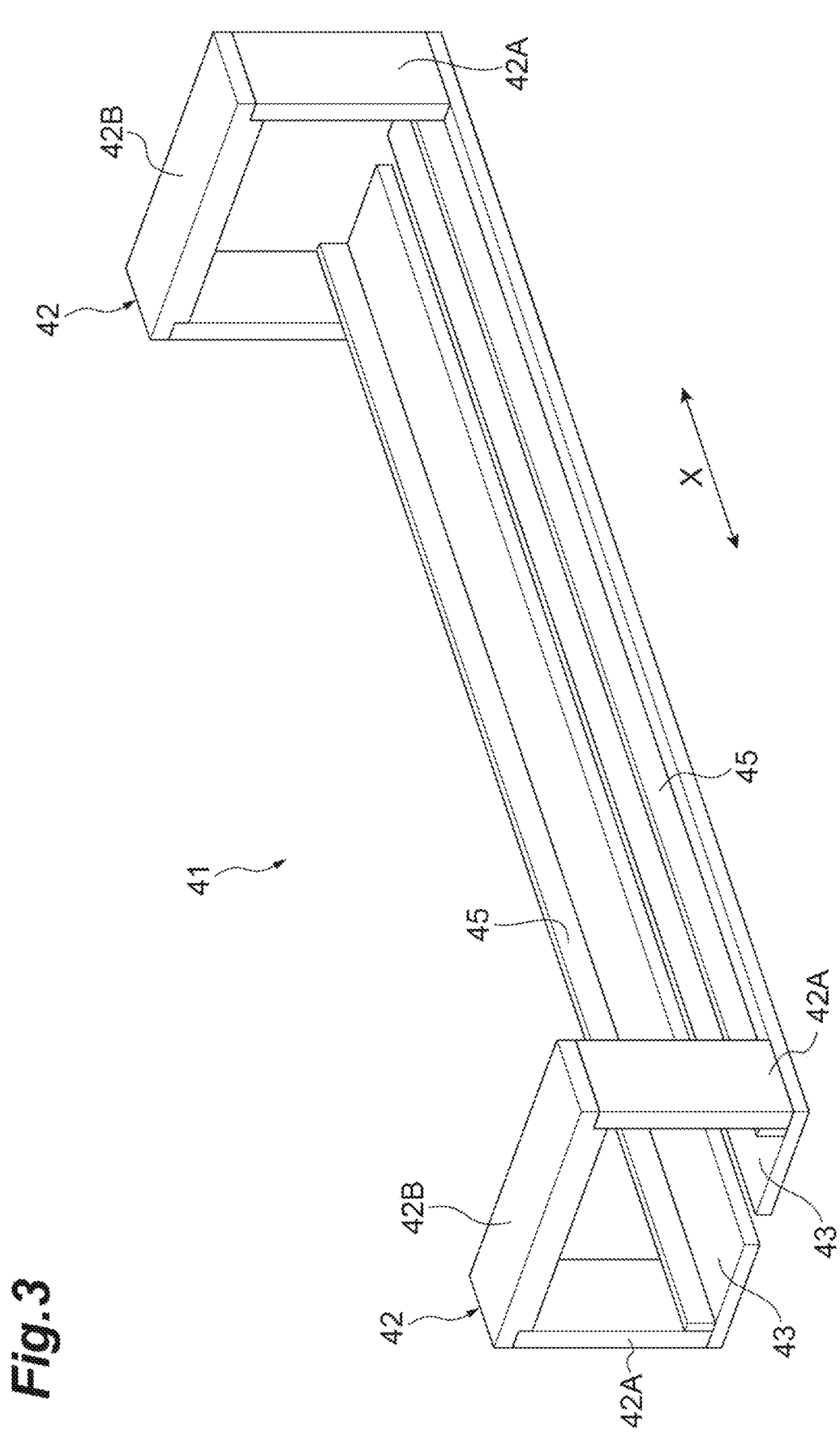
FIG. 3 is a perspective view illustrating a working track in a preferred embodiment of the present invention.

The working track 41 extends in one direction (hereinafter referred to as "extending direction X") such that both ends thereof are continuous to the traveling tracks 4 and 4 and, as illustrated in FIG. 3 and FIG. 4, has an opening 47 to expose at least a portion (for example, power feed cores 57) of the traveling unit 50. In other words, unlike the traveling track 4 illustrated in FIG. 2, the working track 41 does not have the power feeder 40E or the top surface portion 40D, and the part corresponding to the power feeder 40E and the top surface portion 40D of the traveling track 4 is the opening 47.

The working track 41 has frames 42 and 42 disposed at both ends of the working track 41, a pair of lower support portions 43 and 43, and a pair of side support portions 45 and 45.

The frames 42 each have a pair of side surface portions 42A and 42A and a top surface portion 42B. A pair of side surface portions 42A and 42A are plate-shaped members disposed to face each other in the left-right direction and extending in the vertical direction. The side surface portions 42A are fixed to a ceiling with a bracket (not illustrated) and a strut (not illustrated) interposed therebetween. The top surface portion 42B is a plate-shaped member connecting a pair of side surface portions 42A and 42A at the upper ends of a pair of side surface portions 42A and 42A.

The lower support portions 43 support the traveling unit 50 from below. More specifically, the lower support portions 43 are members to allow the inner wheels 51B of the traveling rollers 51 of the traveling vehicle 6 to roll and travel. The lower support portions 43 are each fixed to the lower ends of the side surface portions 42A of the frames 42 and span between a pair of frames 42 and 42 along the extending direction X. Each of the lower support portions 43 is formed such that a first portion 43B facing the inner wheel 51B is positioned above a second portion 43A facing the outer wheel 51A, in the vertical direction. The first portion 43B of the lower support portion 43 (that is, the rolling surface of the inner wheel 51B) is connected flush with the upper surface of the lower surface portion 40B (see FIG. 2) of the traveling track 4, at a section connected to the traveling track 4.

The side support portions 45 are in contact with the side rollers 52 of the traveling vehicle 6. The side support portions 45 are fixed to the side surface portions 42A of the frames 42 and stretched between a pair of frames 42 and 42.

As illustrated in FIG. 5 to FIG. 8, the cleaning unit 100 includes the moving device 60, the suction device (cleaning device) 80, and a unit controller 95. The cleaning unit 100 cleans the traveling vehicle 6 positioned on the working track 41. The moving device 60 moves the traveling vehicle 6 along the working track 41. Since the traveling tracks 4 and 4 are connected to both ends of the working track 41, the moving device 60 moves the traveling vehicle 6 from one traveling track 4 to the other traveling track 4 via the working track 41. The moving device 60 includes a base plate 70, a moving plate 71, a pair of arms including a first arm 61 and a second arm 65, a first rotation driver 62, a second rotation driver 66, a first movement driver 64, and a second movement driver 68.

The base plate 70 is a plate-shaped member supporting the moving plate 71, the first arm 61, the second arm 65, the first rotation driver 62, the second rotation driver 66, the first movement driver 64, and the second movement driver 68. The base plate 70 is suspended from the ceiling by a suspension member 75.

The moving plate 71 is a plate-shaped member supporting the first arm 61, the second arm 65, the first rotation driver 62, the second rotation driver 66, the first movement driver 64, and the second movement driver 68. The moving plate 71 is provided to be movable in the extending direction X with respect to the base plate 70. More specifically, the moving plate 71 is provided to be movable by the second movement driver 68 including a linear motion guide (LM guide) 68A and a driving motor 68B in the extending direction X with respect to the base plate 70.

The first arm 61 is disposed on the upstream side in the traveling direction of the traveling vehicle 6. That is, the first arm 61 comes into contact with the back end (cover 33) of the traveling vehicle 6 when the traveling vehicle 6 is to be moved. The first arm 61 is moved by the first rotation driver 62 between a position where the first arm 61 sandwiches the traveling vehicle 6 (contact position) and a position where the first arm 61 retreats from the traveling vehicle 6 (retreat position). The first arm 61 and the first rotation driver 62 are provided so as to be movable by the first movement driver 64 in the extending direction X with respect to the moving plate 71. More specifically, the first arm 61 and the first rotation driver 62 are provided so as to be movable by the first movement driver 64 including an LM guide 64A and a driving motor 64B in the extending direction X with respect to the moving plate 71.

The second arm 65 is disposed on the downstream side in the traveling direction of the traveling vehicle 6. That is, the second arm 65 comes into contact with the front end of the traveling vehicle 6 when the traveling vehicle 6 is to be moved. The second arm 65 is moved by the second rotation driver 66 between a position where the second arm 65 sandwiches the traveling vehicle 6 and a position where the second arm 65 retreats from the traveling vehicle 6. Unlike the first arm 61 and the first rotation driver 62, the second arm 65 and the second rotation driver 66 are provided so as to be unmovable in the extending direction X with respect to the moving plate 71.

The suction device 80 performs a cleaning operation on at least a portion of the traveling unit 50 through the opening 47 for the traveling vehicle 6 positioned in the working area 160 (working track 41). More specifically, the suction device 80 sucks adhering substances that adhere to at least a portion of (for example, the power feed core 57) of the traveling unit 50. The suction device 80 is provided at a support plate 85 suspended from the ceiling. The suction device 80 is a vertical articulated robot 81 having six (six-axis) joints and has a suction unit 82 at its distal end for sucking adhering substances.

The unit controller 95 is an electronic control unit including a CPU, a ROM, and a RAM. The unit controller 95 can be configured, for example, as software of a computer program stored in the ROM, loaded into the RAM, and executed by the CPU. The unit controller 95 may be configured as hardware with, for example, electronic circuitry. The unit controller 95 is configured or programmed to control the operation of the moving device 60 and the suction device 80. The unit controller 95 is connected to communicate with the transportation controller 90.

The transportation controller 90 is an electronic control unit including a CPU, a ROM, and a RAM. The transportation controller 90 can be configured, for example, as software of a computer program stored in the ROM, loaded into the RAM, and executed by the CPU. The transportation controller 90 may be configured as hardware with, for example, electronic circuitry, for example. The transportation controller 90 is configured or programmed to transmit a transportation command to transport the article 10 to the traveling vehicle 6. The transportation controller 90 is connected to communicate with each of the traveling vehicles 6 and the unit controller 95 of the cleaning unit 100.

Here, as illustrated in FIG. 1, a predetermined position on the traveling track 4 adjacent to an upstream end of the working track 41 in a traveling direction of the traveling vehicle 6 is a first position P1, and a predetermined position on the traveling track 4 adjacent to a downstream end of the working track 41 is a second position P2.

The transportation controller 90 is configured or programmed to transmit a first command, a second command, a third, command, a fifth command, and a sixth command. The first command is a command transmitted to the traveling vehicle 6 to allow the traveling vehicle 6 traveling on the traveling track 4 to travel to the first position P1. The traveling vehicle 6 having received the first command travels to the first position P1 and stops. The second command is a command transmitted to the traveling vehicle 6 to lead a state in which the traveling vehicle 6 is movable by the moving device 60. More specifically, the second command is a command to disable (shut down) control from the outside at least in the traveling unit 50 of the traveling vehicle 6. In the traveling vehicle 6 having received the second command, communication is disconnected from the outside, and the traveling unit 50 is no longer controlled from the outside. Transmission of a command to the moving device 60 and the suction device 80 by the transportation controller 90 is performed through the unit controller 95.

The third command is a command transmitted to the moving device 60 after or simultaneously when the second command is transmitted to the traveling vehicle 6 stopped at the first position P1. The third command is a command to move the traveling vehicle 6 stopped at the first position P1 to the working track 41. The moving device 60 having received the third command transports the traveling vehicle 6 stopped at the first position P1 to the working track 41. The fifth command is a command transmitted to the moving device 60 to move the traveling vehicle 6 from the working track 41 to the second position P2. The moving device 60 having received the fifth command transports the traveling vehicle 6 stopping at the working track 41 to the second position P2.

The sixth command is a command transmitted to the suction device 80 after the third command is transmitted to the traveling vehicle 6. The sixth command is a command to allow the suction device 80 to clean the traveling vehicle 6 stopping at the working track 41. The suction device 80 having received the sixth command starts cleaning the traveling vehicle 6 stopping at the working track 41.

Figure 9:
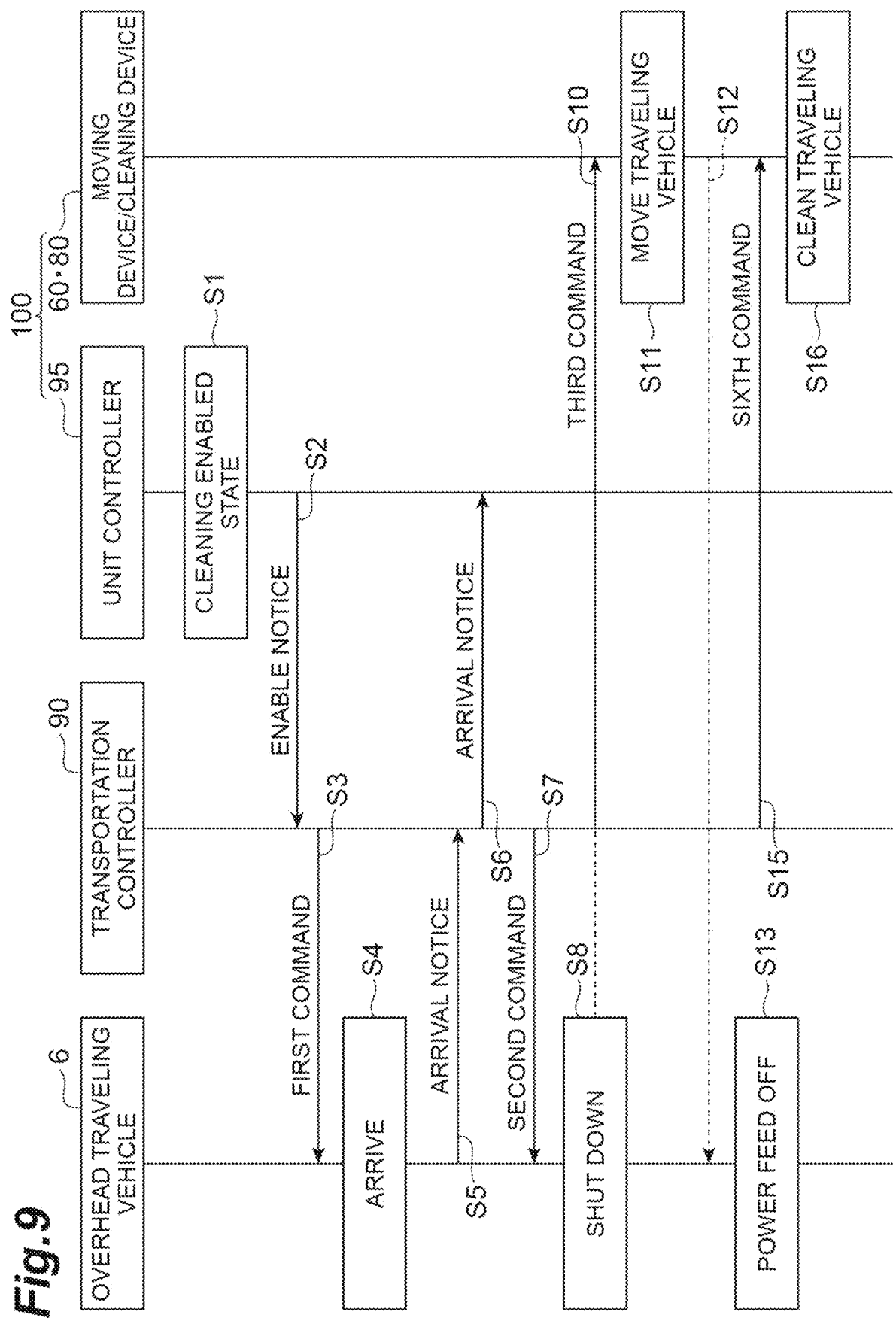
FIG. 9 is a sequence diagram illustrating operation of each unit in cleaning of a traveling vehicle in the traveling vehicle system.

The operation of allowing the traveling vehicle 6 traveling on the traveling track 4 to enter the working track 41, cleaning the traveling vehicle 6 in the cleaning unit 100, and thereafter returning the traveling vehicle 6 to the traveling track 4 again will now be described with reference to FIG. 9 and FIG. 10.

The unit controller 95 determines whether cleaning of the traveling vehicle 6 is enabled in the cleaning unit 100 (step S1). The unit controller 95 determines whether the moving device is positioned at a predetermined position (for example, a position at which the traveling vehicle 6 positioned at the first position P1 can be moved). Here, it is determined that cleaning of the traveling vehicle 6 is enabled if it is detected that the moving device 60 is positioned at the predetermined position. The unit controller 95 may determine that cleaning of the traveling vehicle 6 is enabled by determining whether the traveling vehicle 6 is positioned on the working track 41.

If it is determined that cleaning of the traveling vehicle 6 is enabled in the cleaning unit 100, the unit controller 95 transmits an enable notice indicating the traveling vehicle 6 being enabled in the cleaning unit 100 to the transportation controller 90 (step S2). The transportation controller 90 having received the enable notice transmits the first command to the traveling vehicle 6 (step S3). The traveling vehicle 6 having received the first command travels to the first position P1 and reaches the first position P1 (step S4). The traveling vehicle 6 reaching the first position P1 transmits an arrival notice to the transportation controller 90 (step S5). Upon receiving the arrival notice from the traveling vehicle 6, the transportation controller 90 transmits the type and the like of the arriving traveling vehicle 6 to the unit controller 95 (step S6). This process enables the moving device 60 to operate in accordance with the type (size) and the like of the traveling vehicle 6.

The transportation controller 90 having received the arrival notice transmits the second command to the traveling vehicle 6 (step S7). The traveling vehicle 6 having received the second command is brought into a state in which the traveling vehicle can be moved by the moving device 60. More specifically, in the traveling vehicle 6 having received the second command, external control in the traveling unit 50 of the traveling vehicle 6 is disabled (shut down) (step S8). This process enables the traveling vehicle 6 to be freely moved by the moving device 60. The transportation controller 90 transmits the third command to the moving device 60 at the timing when the traveling vehicle 6 is shut down (step S10). For example, after transmitting the second command, the transportation controller 90 may transmit the third command to the moving device 60 after elapse of a predetermined time. As described above, transmission of the third command from the transportation controller 90 to the moving device 60 is performed through the unit controller 95.

The moving device 60 having received the third command moves the traveling vehicle 6 stopping at the first position P1 to the working track 41 (step S11). The operation of the moving device 60 moving the traveling vehicle 6 from the first position P1 to the working track 41 will now be described in detail.

Figure 11A:
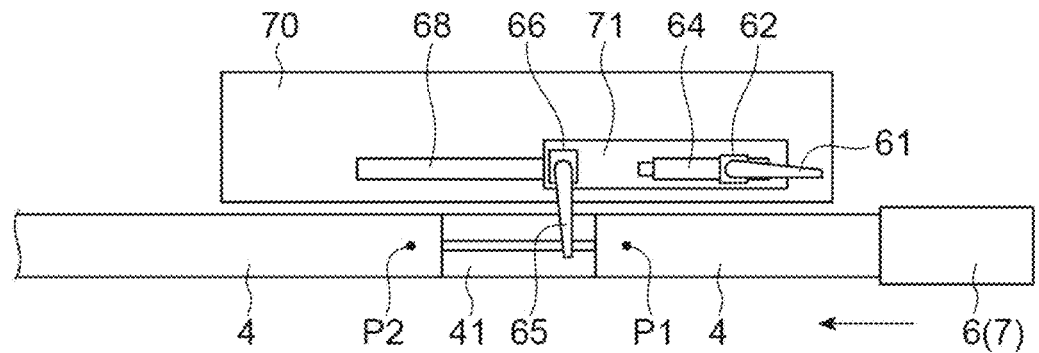
FIGS. 11A to 11D are diagrams illustrating operation of the moving device in FIG. 5.
Figure 11B:
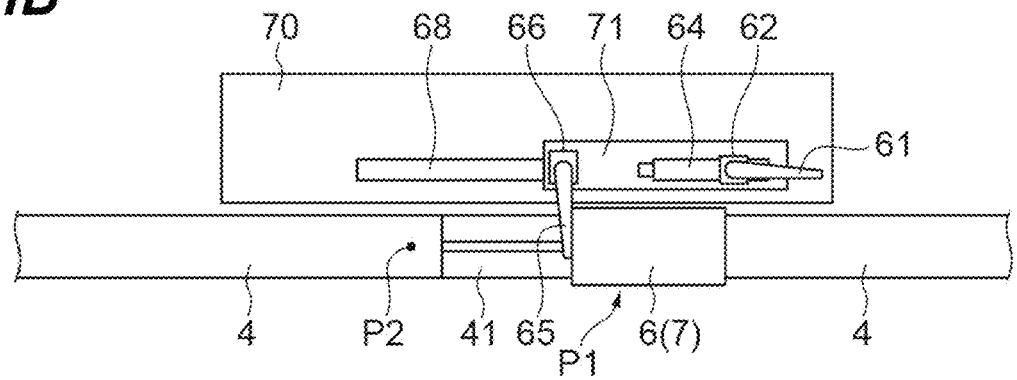

When the traveling vehicle 6 is not present on the working track 41, as illustrated in FIG. 11A, the first arm 61 is positioned at the retreat position, and the second arm 65 is positioned at the contact position. In such a state, when the traveling vehicle 6 having received the first command enters the working track 41, as illustrated in FIG. 11B, the traveling vehicle 6 temporarily stops at a position in contact with the second arm 65. This position is the first position P1.

Figure 11C:
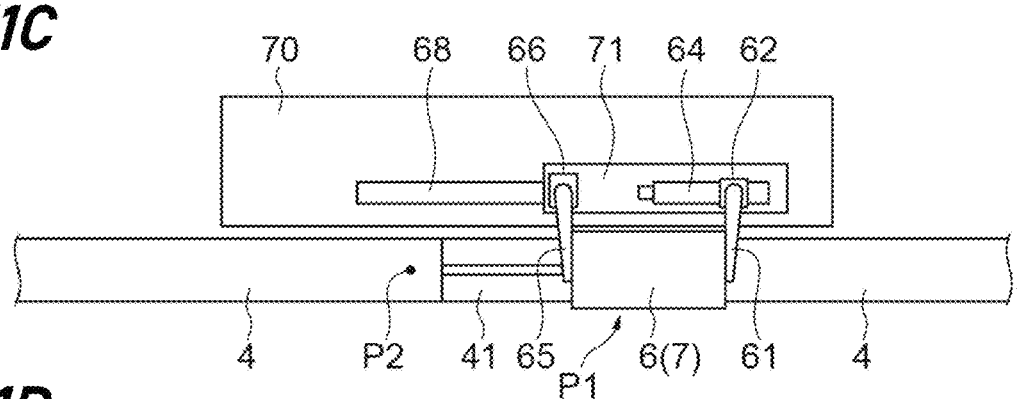

When the traveling vehicle 6 temporarily stops at a position in contact with the second arm 65, the first rotation driver 62 of the moving device 60 having received the third command rotates the first arm 61 to the contact position, and the first movement driver 64 advances the first arm 61 and the first rotation driver 62 (moves to the downstream side in the traveling direction of the traveling vehicle 6). As a result, as illustrated in FIG. 11C, the traveling vehicle 6 is sandwiched between the first arm 61 and the second arm 65.

Figure 11D:
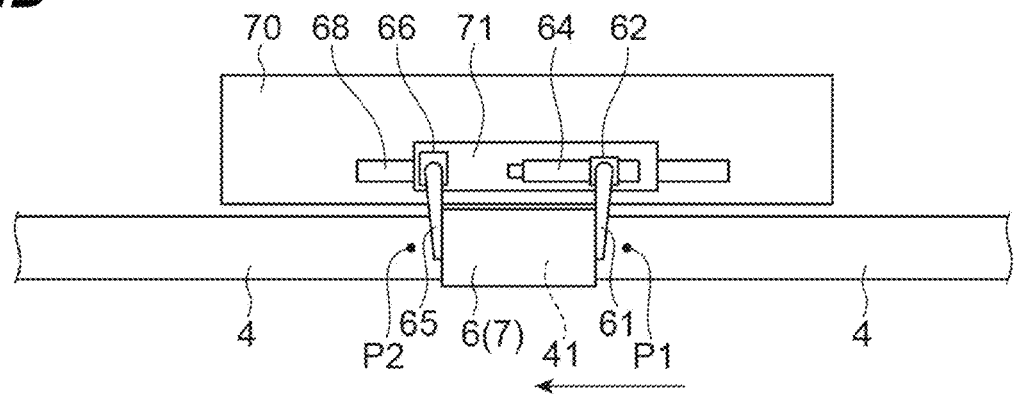

Subsequently, the second movement driver 68 advances the moving plate 71. That is, while keeping the distance between the first arm 61 and the second arm 65, the second movement driver 68 advances the first arm 61, the first rotation driver 62, the second arm 65, and the second rotation driver 66. In the middle of advancement of the traveling vehicle 6 by the moving device 60, the traveling vehicle 6 transfers from the traveling track 4 to the working track 41. That is, the traveling vehicle 6 transfers from a power feed area to a non-power feed area. At this timing (step S12), power feed to the traveling vehicle 6 is interrupted, and power feed to the traveling vehicle 6 is turned off (step S13). The traveling vehicle 6 sandwiched between the first arm 61 and the second arm 65 is advanced and, as illustrated in FIG. 11D, stopped at a predetermined position on the working track 41. This position is a position where the traveling vehicle 6 is cleaned by the suction device 80.

Subsequently, the transportation controller 90 transmits the sixth command to the suction device 80 (step S15). As described above, transmission of the sixth command from the transportation controller 90 to the suction device 80 is performed through the unit controller 95. The suction device 80 having received the sixth command starts cleaning the traveling vehicle 6 stopping at the predetermined position on the working track 41 (step S16). At the timing when cleaning of the traveling vehicle 6 by the suction device 80 is finished, the transportation controller 90 transmits the fifth command to the moving device 60 (step S17). The transportation controller 90 may transmit the fifth command to the moving device 60 after a predetermined time has elapsed since the sixth command is transmitted to the suction device 80. The moving device 60 having received the fifth command moves the traveling vehicle 6 from the predetermined position on the working track 41 to the second position P2 (step S18). The operation of the moving device 60 moving the traveling vehicle 6 from the predetermined position on the working track 41 to the second position P2 will now be described in detail.

Figure 12A:
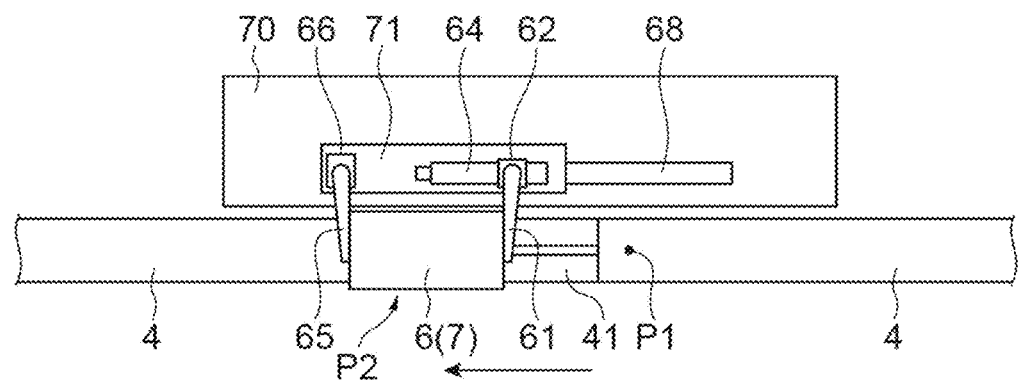
FIGS. 12A to 12D are diagrams illustrating operation of the moving device in FIG. 5.

The traveling vehicle 6 sandwiched between the first arm 61 and the second arm 65 is advanced and, as illustrated in FIG. 12A, moved from the predetermined position on the working track 41 to the second position P2 on the traveling track 4. In the middle of advancement of the traveling vehicle 6 by the moving device 60, the traveling vehicle 6 transfers from the working track 41 to the traveling track 4. That is, the traveling vehicle 6 transfers from the non-power feed area to the power feed area. At this timing (step S21), power feed to the traveling vehicle 6 is started, and power feed to the traveling vehicle 6 is turned on (step S22). When the traveling unit 50 of the traveling vehicle 6 changes from a state in which electric power is not supplied to a state in which electric power is supplied, external control is enabled (started) (step S23).

When activated such that external control is enabled in the traveling unit 50, the traveling vehicle 6 transmits an activation notice to the transportation controller 90 (step S24). The transportation controller 90 having received the activation notice transmits a move command to move to a predetermined position on the main line 4A, to the traveling vehicle 6 that has transmitted the activation notice (step S25). With this process, the traveling vehicle 6 returns to the main line 4A.

Figure 12B:
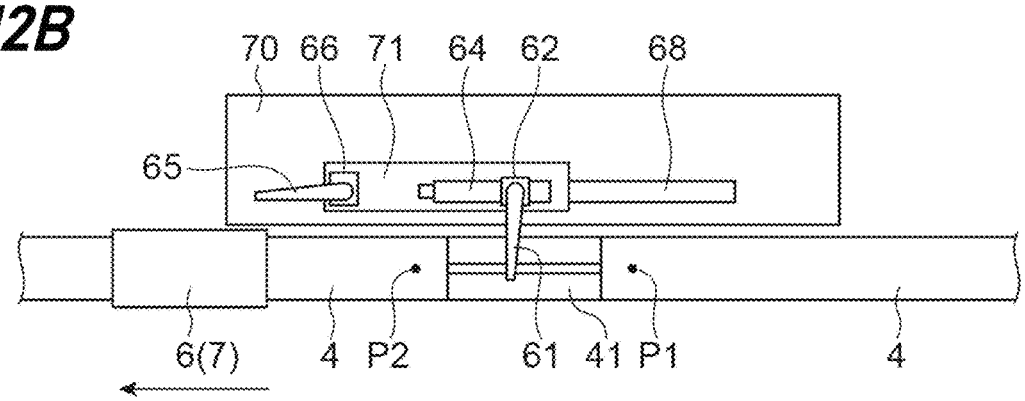

When the moving device 60 moves the traveling vehicle 6 to the second position P2, as illustrated in FIG. 12B, the second rotation driver 66 rotates the second arm 65 to the retreat position. Subsequently, the traveling vehicle 6 starts advancing by the driver of the traveling unit 50 of the traveling vehicle 6 by electric power supplied to the power feed cores 57 of the traveling unit 50. Simultaneously, the transportation controller 90 gives an instruction to the unit controller 95 to return the moving device 60 to a predetermined position (for example, a position at which the traveling vehicle 6 positioned at the first position P1 can be moved) (step S26).

Figure 12C:
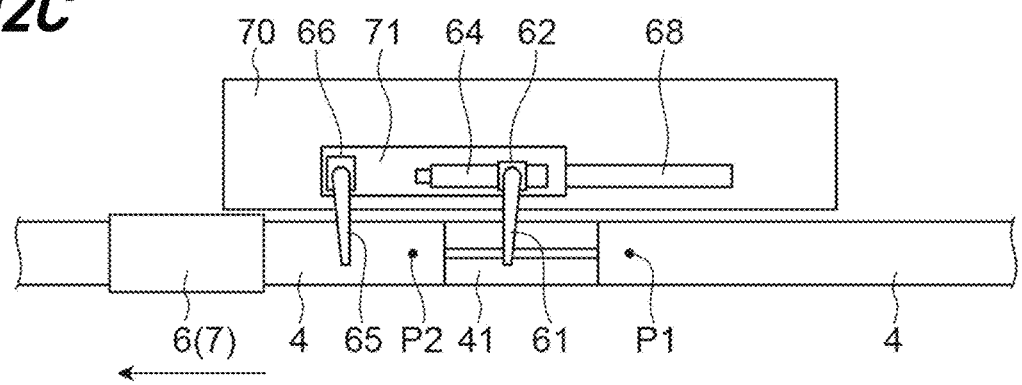
Figure 12D:
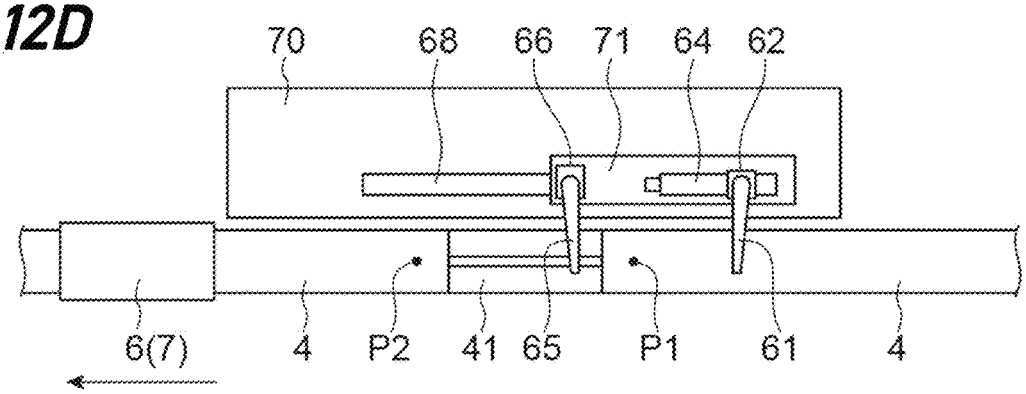

Subsequently, as illustrated in FIG. 12C, the second rotation driver 66 rotates the second arm 65 to the contact position. The second movement driver 68 then retreats the moving plate 71. That is, while keeping the distance between the first arm 61 and the second arm 65, the second movement driver 68 retreats the first arm 61, the first rotation driver 62, the second arm 65, and the second rotation driver 66. Subsequently, the first movement driver 64 retreats the first arm 61 and the first rotation driver 62. Thus, as illustrated in FIG. 12D, the first arm 61 and the second arm 65 return to a position where the traveling vehicle 6 entering subsequently is awaited. Then, as illustrated in FIG. 11A, arrival of the next traveling vehicle 6 is awaited with the first arm 61 positioned at the retreat position and the second arm 65 positioned at the contact position (step S27).

The operational effects of the traveling vehicle system 1 in the foregoing preferred embodiment will now be described. In the traveling vehicle system 1 in the foregoing preferred embodiment, the traveling vehicle 6 is brought into a state in which the traveling vehicle 6 can be freely moved by the moving device 60, at a position (first position P1) before entering the working track 41, and movement of the traveling vehicle 6 by the moving device 60 is started. With this configuration, movement of the traveling vehicle 6 from the traveling track 4 to the working track 41 can be automated.

In the traveling vehicle system 1 in the foregoing preferred embodiment, the transportation controller 90 transmits to the traveling vehicle 6 the second command to disable control from the outside (transportation controller 90) at least in the traveling unit 50. In this configuration, although control from the outside (transportation controller 90) is disabled, the traveling vehicle 6 is supplied with electric power while traveling on the traveling track 4 and therefore the outer wheels 51A are not braked. That is, in the present preferred embodiment, the traveling vehicle 6 can be brought into a state in which the traveling vehicle 6 can be freely moved by the moving device 60, with simple control.

In the traveling vehicle system 1 in the foregoing preferred embodiment, the transportation controller 90 transmits to the moving device 60 the fifth command to move the traveling vehicle 6 from a predetermined position on the non-power feed track to the second position P2. In this configuration, in addition to the movement of the traveling vehicle 6 from the traveling track 4 to the working track 41, movement of the traveling vehicle 6 from the working track 41 to the traveling track 4 can be automated. That is, movement of the traveling vehicle 6 between the traveling track 4 and the working track 41 can be automated.

In the traveling vehicle system 1 in the foregoing preferred embodiment, the traveling unit 50 is configured or programmed such that control from the outside (transportation controller 90) is enabled when the traveling unit 50 changes from a state in which electric power is not supplied to a state in which electric power is supplied. With this configuration, when the traveling vehicle 6 is moved by the moving device 60 from the working track 41 to the traveling track 4, control of the traveling vehicle 6 from the outside is automatically enabled.

In the traveling vehicle system 1 in the foregoing preferred embodiment, the transportation controller 90 transmits the third command and thereafter transmits the sixth command to clean the traveling vehicle to the suction device 80 through the unit controller 95. With this configuration, in addition to the movement of the traveling vehicle 6 from the traveling track 4 to the working track 41, the cleaning process by the suction device 80 can also be automated.

Although preferred embodiments according to various aspects of the present invention have been described above, preferred embodiments of the present invention are not limited to the foregoing preferred embodiments and may be modified and/or combined without departing from the spirit of the present invention.

In the foregoing preferred embodiments, an example in which the transportation controller 90 transmits to the traveling vehicle 6 moved to the first position P1 the second command to disable control from the outside (transportation controller 90) at least in the traveling unit 50 has been described. However, the present invention is not limited thereto. For example, instead of the example in which the second command is transmitted, the transportation controller 90 may transmit to the traveling vehicle 6 stopped at the first position P1 a fourth command to cut off power supply at least to the traveling unit 50. Also in this case, even if control of the traveling vehicle 6 from the outside is enabled, the traveling vehicle 6 is unable to travel because no electric power is supplied to the traveling unit 50. Then, the first portion 43B and the second portion 43A, which are provided on the working track 41 (see FIG. 4), are also provided between the first position P1 and the working track 41 and between the working track and the second position P2 in the traveling track 4. More specifically, on the traveling surface of the traveling track 4, the first portion facing the inner wheel 51B is positioned above the second portion facing the outer wheel 51A, in the vertical direction. In such a modification, the traveling vehicle 6 can also be brought into a state in which the traveling vehicle 6 can be freely moved by the moving device 60.

In the foregoing preferred embodiments, an example in which the working area 160 (that is, the working track 41) is disposed between the traveling track 4 and the traveling track 4 has been described. However, the working area 160 may be disposed at a terminal end of the traveling track 4. In this case, the moving direction of the moving device 60 by the third command and the moving direction of the moving device 60 by the fifth command are directions opposite to each other. That is, the third command allows the traveling vehicle 6 to enter from the traveling track 4 to the working track 41, and the fifth command allows the traveling vehicle 6 to retreat from the working track 41 to the traveling track 4.

An example in which the first arm 61 and the second arm 65 in the moving device 60 in the foregoing preferred embodiments are provided at the moving plate 71 and move integrally in the extending direction X has been described. However, the present invention is not limited thereto. For example, the first arm 61 and the second arm 65 may be provided at the base plate 70 and may be provided to be movable independently in the extending direction X with respect to the base plate 70.

An example in which the lower support portion 43 in the working track 41 in the foregoing preferred embodiments is formed such that the first portion 43B is positioned above the second portion 43A in the vertical direction has been described above. However, the present invention is not limited thereto. For example, when the wheel of the traveling unit 50 is formed as the inner wheel 51B and the auxiliary wheel is formed as the outer wheel 51A, the second portion 43A may be formed to be positioned above the first portion 43B.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

The invention claimed is:

1. A traveling vehicle system comprising:
   a power feed track including a power feeder to supply electric power to a traveling driver of a traveling vehicle;
   a non-power feed track connected to the power feed track and having no power feeder;
   a mover to move the traveling vehicle between a first position on the power feed track and the non-power feed track; and
   a controller configured or programmed to control at least the traveling vehicle and the mover; wherein
   the controller configured or programmed transmit to the traveling vehicle a first command to travel to the first position, transmit to the traveling vehicle stopped at the first position a second command to adopt a state in which the traveling vehicle is movable by the mover and simultaneously or thereafter transmit to the mover a third command to move the traveling vehicle stopped at the first position to the non-power feed track; and
   the controller is configured or programmed to transmit to the traveling vehicle the second command to disable control from outside at least in the traveling driver.

2. The traveling vehicle system according to claim 1, wherein
   the traveling driver includes a wheel to be braked at a time of no power feed and an auxiliary wheel to rotate freely;
   the power feed track between the first position and the non-power feed track, and the non-power feed track including a lower support portion, support the wheel and the auxiliary wheel from below;
   the lower support portion includes a first portion facing the auxiliary wheel positioned above a second portion facing the wheel, in a vertical direction; and
   the controller is configured or programmed to transmit to the traveling vehicle stopped at the first position a fourth command to cut off power supply at least to the traveling driver.

3. The traveling vehicle system according to claim 2, wherein the controller is configured or programmed to transmit to the mover a fifth command to move the traveling vehicle from the non-power feed track to the first position or to a second position on the power feed track connected to the power feed track having the first position with the non-power feed track interposed therebetween.

4. The traveling vehicle system according to claim 3, wherein the traveling driver is configured or programmed such that control from outside is enabled when a state in which electric power is not supplied changes to a state in which electric power is supplied.

5. The traveling vehicle system according to claim 2, wherein the traveling driver is configured or programmed such that control from outside is enabled when a state in which electric power is not supplied changes to a state in which electric power is supplied.

6. The traveling vehicle system according to claim 2, further comprising a cleaner to clean the traveling vehicle moved to the non-power feed track; wherein
   the controller is configured or programmed to transmit to the cleaner a sixth command to clean the traveling vehicle, after transmitting the third command to the mover.

7. The traveling vehicle system according to claim 1, wherein the controller is configured or programmed to transmit to the mover a fifth command to move the traveling vehicle from the non-power feed track to the first position or to a second position on the power feed track connected to the power feed track having the first position with the non-power feed track interposed therebetween.

8. The traveling vehicle system according to claim 7, wherein the traveling driver is configured or programmed such that control from outside is enabled when a state in which electric power is not supplied changes to a state in which electric power is supplied.

9. The traveling vehicle system according to claim 7, further comprising a cleaner to clean the traveling vehicle moved to the non-power feed track; wherein
the controller is configured or programmed to transmit to the cleaner a sixth command to clean the traveling vehicle, after transmitting the third command to the mover.

10. The traveling vehicle system according to claim 1, wherein the traveling driver is configured or programmed such that control from outside is enabled when a state in which electric power is not supplied changes to a state in which electric power is supplied.

11. The traveling vehicle system according to claim 10, further comprising a cleaner to clean the traveling vehicle moved to the non-power feed track; wherein
the controller is configured or programmed to transmit to the cleaner a sixth command to clean the traveling vehicle, after transmitting the third command to the mover.

12. The traveling vehicle system according to claim 1, further comprising a cleaner to clean the traveling vehicle moved to the non-power feed track; wherein
the controller is configured or programmed to transmit to the cleaner a sixth command to clean the traveling vehicle, after transmitting the third command to the mover.

13. The traveling vehicle system according to claim 1, wherein the controller is configured or programmed to transmit to the mover a fifth command to move the traveling vehicle from the non-power feed track to the first position or to a second position on the power feed track connected to the power feed track having the first position with the non-power feed track interposed therebetween.

14. The traveling vehicle system according to claim 13, wherein the traveling driver is configured or programmed such that control from outside is enabled when a state in which electric power is not supplied changes to a state in which electric power is supplied.

15. The traveling vehicle system according to claim 1, wherein the traveling driver is configured or programmed such that control from outside is enabled when a state in which electric power is not supplied changes to a state in which electric power is supplied.

16. The traveling vehicle system according to claim 1, further comprising a cleaner to clean the traveling vehicle moved to the non-power feed track; wherein
the controller is configured or programmed to transmit to the cleaner a sixth command to clean the traveling vehicle, after transmitting the third command to the mover.

17. A traveling vehicle system comprising:
a power feed track including a power feeder to supply electric power to a traveling driver of a traveling vehicle;
a non-power feed track connected to the power feed track and having no power feeder;
a mover to move the traveling vehicle between a first position on the power feed track and the non-power feed track; and
a controller configured or programmed to control at least the traveling vehicle and the mover; wherein
the controller configured or programmed transmit to the traveling vehicle a first command to travel to the first position, transmit to the traveling vehicle stopped at the first position a second command to adopt a state in which the traveling vehicle is movable by the mover and simultaneously or thereafter transmit to the mover a third command to move the traveling vehicle stopped at the first position to the non-power feed track;
the traveling driver includes a wheel to be braked at a time of no power feed and an auxiliary wheel to rotate freely;
the power feed track between the first position and the non-power feed track, and the non-power feed track including a lower support portion, support the wheel and the auxiliary wheel from below;
the lower support portion includes a first portion facing the auxiliary wheel positioned above a second portion facing the wheel, in a vertical direction; and
the controller is configured or programmed to transmit to the traveling vehicle stopped at the first position a fourth command to cut off power supply at least to the traveling driver.

* * * * *